United States Patent [19]

Teeple, Jr.

[11] 4,340,860

[45] Jul. 20, 1982

[54] INTEGRATED CIRCUIT CARRIER PACKAGE TEST PROBE

[75] Inventor: Lawrence R. Teeple, Jr., Palo Alto, Calif.

[73] Assignee: Trigon, Mountain View, Calif.

[21] Appl. No.: 151,128

[22] Filed: May 19, 1980

[51] Int. Cl.³ .............................................. G01R 31/02
[52] U.S. Cl. ................................. 324/158 F; 200/245; 324/51; 324/158 P
[58] Field of Search ............... 324/158 P, 158 F, 72.5, 324/51, 52, 54; 200/245, 257, 267

[56] References Cited

U.S. PATENT DOCUMENTS 4,065,717 12/1977 Kattner et al. .................. 324/158 F

*Primary Examiner*—Ernest F. Karlsen
*Attorney, Agent, or Firm*—Claude A. S. Hamrick

[57] ABSTRACT

An IC carrier package test probe including a test probe head which is formed to penetrate into the IC chip cavity of the carrier package and which includes an elastic base having a thin layer of metal foil affixed to the outer face thereof, which foil is slited for greater elasticity and which is disposed to make simultaneous contact with each interior lead contact point within the cavity to permit rapid electrical testing of the continuity of the carrier package circuitry.

9 Claims, 5 Drawing Figures

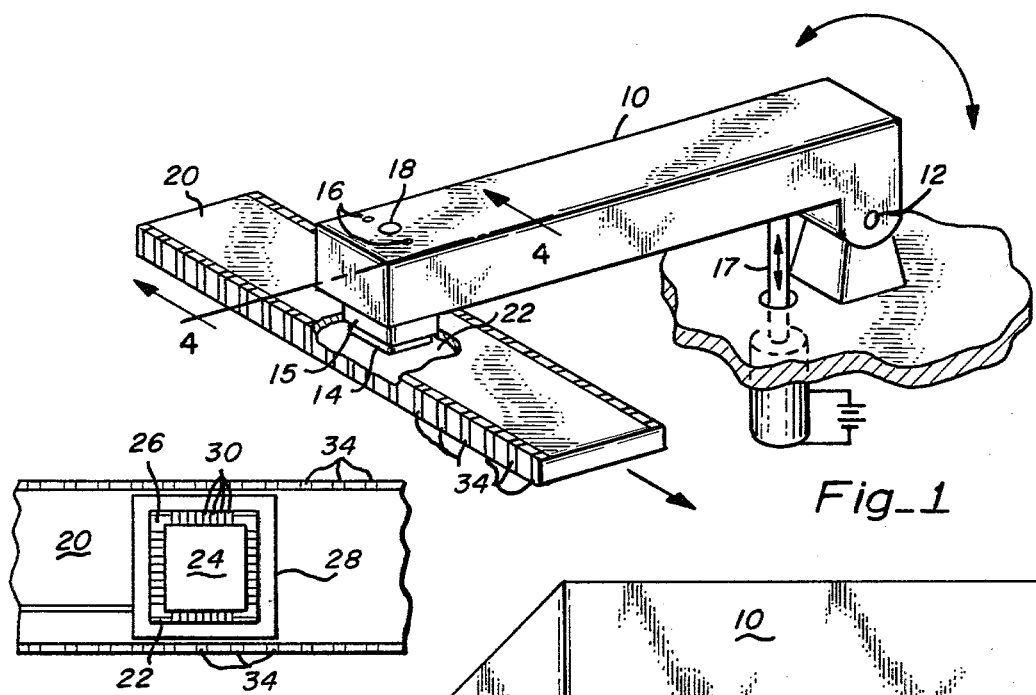
Fig_1
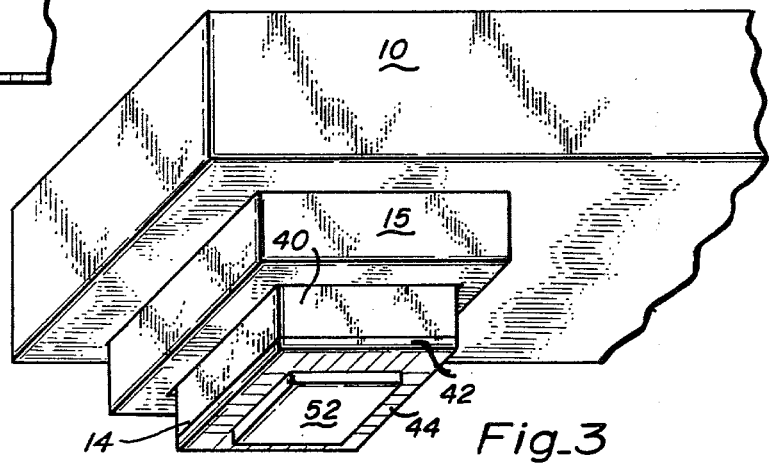
Fig_2
Fig_3
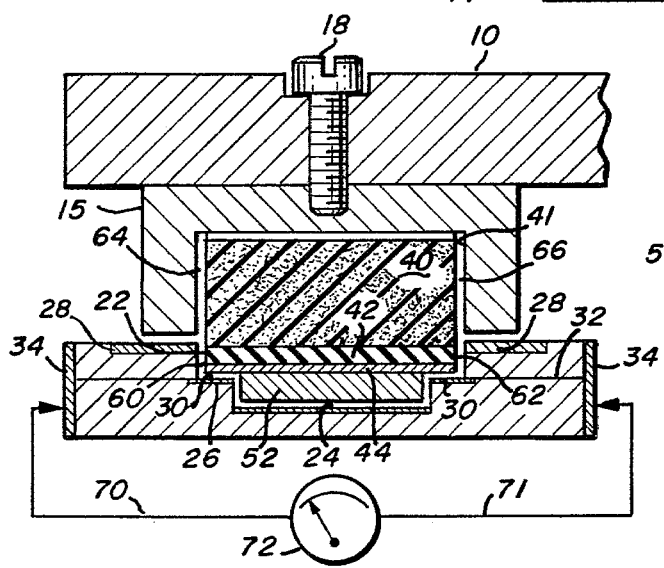
Fig_4
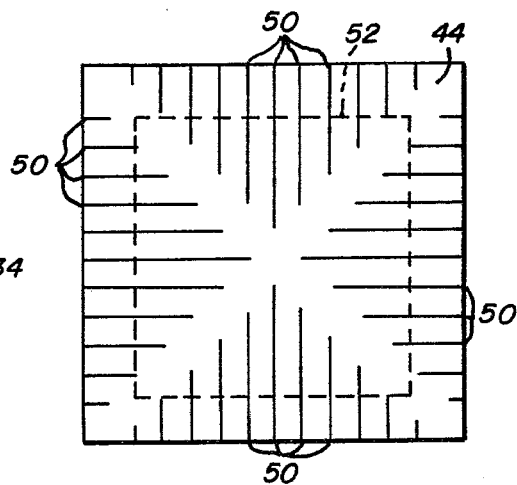
Fig_5

INTEGRATED CIRCUIT CARRIER PACKAGE TEST PROBE

BACKGROUND OF THE INVENTION

1. Field of the Invention

The present invention relates generally to a an apparatus for testing integrated circuit carrier packages and more particularly, to a probe for testing the continuity of circuits within a printed wiring integrated circuit carrier package.

2. Description of the Prior Art

Until the advent of the side-brazed leadless packages, integrated circuit (IC) chips were mounted in dual-inline package (DIP) devices having stamped or etched lead frames which included exterior contact pins integrally formed with each conductive lead member. Because of the integral conductor structure, it was therefore a rarity that any conductor of the DIP was not intact and thus the conductivity of each conductor was not normally questioned. However, since side-brazed leadless packages are manufactured in a substantially different manner than were prior art DIP devices, i.e., they are made by building up several layers of ceramic substrate having conductive strips electrochemically arrayed thereon with interconnections being made during processing, it has become necessary to test each lead of the device to insure conductivity between the exterior leg contact point and the interior contact points arrayed around the IC chip receiving cavity.

The standard prior testing approach has been to use individual probes to sequentially test each circuit within the package. However, as the interior contact points are only approximately 20 thousandths of an inch wide, a microscopic means to direct the test probe is required. It has proven to be difficult and time consuming to individually test each of the package conductors in this manner.

Another approach has been to use a testing plug which has individual circuits formed on the surface thereof. Each circuit is formed to make contact with a different interior contact point of the carrier package. To test the package a test current is passed through each plug circuit to each carrier circuit. The difficulty of this approach is that the individual circuits of the plug must be accurately aligned with the interior contact points in order to properly test the package. Alignment of the plug has proved to be difficult and time consuming. Also, as the interior contact points are usually not all disposed in exactly the same horizontal plane, it is difficult to achieve proper electrical contact.

A further approach has been to utilize a test plug composed of a conductive elastomer. The plug is inserted into the IC chip cavity in the carrier package so as to shunt each interior contact point to the other interior contact points. The package leads may be then tested for internal circuit continuity by testing the continuity between successive exterior contact points. This approach is inadequate and inefficient because the surface area of the contact between the elastomer and the IC contact points is very small and fails to provide uniform conductivity. Even moderate production requires a relatively uniform conductivity for automatic testing. Moreover, total process time of each device must be a very small fraction of a second. Conductive polymers are not suitable because they require from $\frac{1}{4}$th of a second to one second to stabilize and establish conductivity through the material.

SUMMARY OF THE PRESENT INVENTION

It is therefore a primary objective of the present invention to provide an IC carrier package test probe which does not require separate alignment with the individual interior contact points of the carrier package.

It is another object of the present invention to provide an IC carrier package test probe which is sufficiently elastic to make good electrical contact with each interior contact point of the carrier package.

It is a further object of the present invention to provide an IC carrier package test probe which has high conductivity and shunts all of the interior contact points of the carrier package together.

It is yet another object of the present invention to provide an IC carrier package test probe which permits the testing of the circuits within the carrier package solely by electrical test contact with the peripherally disposed exterior contact points of the carrier package.

It is yet a further object of the present invention to provide an improved IC carrier package test probe which is inexpensive to manufacture and quick and easy to use.

The IC carrier package test probe of the present invention includes a positioning means formed to dispose a test probe head in aligned relation to the IC chip cavity formed within a side-brazed leadless ceramic carrier package. The probe head is formed to penetrate into the cavity and includes an elastic base having a thin layer of metal foil affixed to the outer face thereof. The foil is disposed to make simultaneous contact with each interior lead contact point within the cavity when the probe is inserted therein. To increase the elasticity of the foil, a plurality of slits are formed therein which extend outwardly to the perimeter thereof. Additionally, a filler plate may be centrally disposed upon the foil to prevent undue distortion of the foil when the probe is inserted into the cavity.

A primary advantage of the present invention is that it utilizes a patterned metal foil superimposed upon an elastic base to provide a good electrical contact with each interior contact point of the carrier package. Furthermore, the probe can be used repeatedly without altering the contact surface continuity, a feature essential to probing all contact points in the carrier cavity.

Another advantage of the present invention is that it shunts all of the interior contact points together, permitting the testing of the carrier package solely by electrical test contact with the peripherally disposed exterior contact points of the carrier package.

A further advantage of the present invention is that the test probe is inexpensive to manufacture and allows quick and easy testing of the carrier package.

IN THE DRAWINGS

FIG. 1 is a perspective view of a testing configuration depicting a side-brazed leadless ceramic IC carrier package and a test probe in accordance with the present invention;

FIG. 2 is a partial top plan view illustrating the IC receiving cavity of a typical leadless ceramic carrier package;

FIG. 3 is an enlarged lower perspective view more clearly showing features of the test probe head;

FIG. 4 is a cross sectional view taken along line 4—4 of FIG. 1 and showing the test probe in mating test relationship with an IC carrier package; and FIG. 5 is a top plan view of the test probe head of the present invention depicting a metal foil slit configuration.

DETAILED DESCRIPTION OF THE PREFERRED EMBODIMENT

The integrated circuit carrier package test probe of the present invention is designed to be inserted into the IC chip receiving cavity of a side-brazed leadless ceramic IC carrier package. FIG. 1 depicts a testing configuration utilizing a pivotable arm 10 having one end which is hinged 12 and which carries an IC carrier package test probe head 14 in a retangularly shaped cup-like receptacle 15 located at its other end. Simple alignment pegs (not shown), which mate with bores 16, and a screw 18 are utilized to attach the test probe head support cup 15, however, other methods of attachment could be used. A standard actuating device 17 may be engaged to the arm 10 to control the movement thereof. In this testing configuration the ceramic IC carrier package 20 is moved by means not illustrated into a test position as shown, whereupon the arm 10 is lowered to insert test head 14 into its test position in the IC chip cavity 22. It is recognized that many alternative means could be used to position the head 14 in inserted relation within the carrier package cavity 22.

A typical IC chip cavity in an IC carrier package is depicted in top plan view in FIG. 2 and in cross section in FIG. 4. The cavity 22 has a flat inner base 24, a raised shoulder 26 surrounding the base and a metalized rim 28 surrounding the cavity. The interior lead ends or contact points 30 are disposed in a rectangular array along the upper surface of the raised shoulder 26. The carrier package 20 is composed of several layers, each of which has one or more metallic circuit traces or leads 32, each of which connect an interior contact point 30 with a peripherally disposed exterior contact point 34. The layers are placed one on top of the other and bonded together to form the carrier package, the above-mentioned shoulder 26 being simultaneously created and having all of the interior contact points located proximate one another. After formulation, the surface of the shoulder 26 has a variation of approximately 0.001-0.004 inches.

The test probe head 14, as further depicted in FIGS. 3 and 4, is rectangularly configured so as to fit within the IC chip cavity 22 of the carrier package and includs an elastomeric member 40 which projects outwardly from the mounting cavity 41 formed in cup 15. Member 40 typically has a thickness of approximately 60 thousandths of an inch and is formed of an elastomer, such as silicone sponge or neoprene, to provide the elastic properties that are required of the head, and discussed hereinafter.

A silicone layer 42 of approximately 0.004 inches thickness is affixed to the outer face of member 40 to provide a firm base for the conductive plate 44. Plate 44 is comprised of a thin layer of metal foil which is bonded to the outer face of the base 42. It is formed to be co-extensive in size with the outer face of base 42, such that when the head is inserted into the chip cavity the outer edge of the foil rests on the interior contact points 30 formed on shoulder 26. The foil is thus formed to make simultaneous contact with every interior contact point located along the shoulder 26. Although the plate 44 could be bonded directly to member 40, it has been found that such practice does not always produce good bonding and also makes it difficult to etch slits into the foil. To solve these problems, the thin base layer 42 of silicone is utilized to aid in the joining of the metal foil to the elastomeric member 40. The thin silicone layer 42 transmits the elastic properties of member 40 to the foil 44 and provides a superior surface for the bonding of the metal foil to the member 40.

The elastomeric member 40 must possess sufficient elasticity to enable it to deform under pressure from the arm and press the metal foil 44 into electrical contact with each of the interior contact points 30 located along the shoulder 26. The metal foil itself must therefore be very ductile to allow it to deform along with the elastic base and make good contact. A nickel foil having a thickness of from approximately three to five ten-thousandths of an inch has been found to provide adequate results.

It will be appreciated that as the probe head 14 is pressed into contact with the shoulder 26 it will be deformed both upwardly, i.e., be compressed, and outwardly, i.e., its perimeter will expand. It will also be appreciated that if the perimetric expansion should exceed the elastic limit of foil 44 permanent deformation of the foil will occur and the foil will be deformed as the head is withdrawn and the elastomer contracts to its original dimensions. In order to avoid such deformation, slits 50 are provided in foil 44 which allow it to "flow" with the elastomer as it deforms but without causing any part of the foil to exceed its elastic limit. Although the slit configuration could take many forms, the preferred configuration is as is illustrated in FIG. 5. In such configuration, the slits 50 are typically 0.001-0.003 inches in width are formed on 0.040 inch centers and extend normal to each edge of the foil inwardly to points just short of the foil plate diagonals.

In order to stiffen the central portion of the heads contact surface, a small rectangular filler plate 52 is attached to the center portion of the foil plate 44. The filler plate 52 is typically 0.020 inches in thickness, has external dimensions slightly less than those of the cavity base 24 and is made of aluminum or other light weight metal. Although this plate is not absolutely required, it has been found that performance of the head is improved through its use since it tends to reduce bowing of the unsupported central region of the foil 44 and thus assists in insuring maximum surface contact between foil 44 and the internal lead contact points 30.

Manufacture of the test probe head is accomplished by first bonding the foil 44 to the silicone layer 42, thus providing the foil with sufficient backing strength for the slit forming operation. The slits 50 are then formed in the foil at appropriate locations by a standard etching process. Thereafter, the elastomeric member 40 is bonded to the silicone layer 42. A standard elastic bonding agent, such as RTV, is utilized to bond the foil, silicone layer and elastomeric member together.

To allow for the production of test probe heads of differing sizes and shapes, a stock head is produced of larger dimension than is required for the largest applications. This stock head is then cut to the appropriate size and shape for a particular application. The cutting away of material from each side of the stock head is accomplished symmetrically such that the resulting test head has a slit pattern that is symmetrical about its center, giving the foil equal elastic properties in all directions. An appropriately sized filler plate is then centrally bonded to the metal foil to complete the manufacture of the probe head device. The probe head is thereafter joined to the receptacle 15, by bonding or other suitable means, to ready it for operation.

The operation of the device will now be described.

The test probe head is inserted into the IC chip cavity of a carrier package by a suitable positioning means such as that depicted in FIG. 1. After insertion, the head is compressed a distance of approximately 10–15 thousandths of an inch by a suitable pressure exerted by the actuating means 17. The vertical compression causes the elastomeric member 40 to be displaced in an approximately hydraulic manner, filling the cavity 22 and pressing the foil 44 into firm contact with each of the interior contact points 30 disposed along the shoulder 26. To allow for the expansion of the periphery of the elatomeric member 40, the base 42 and attached foil 44, the test head is sized to be slightly smaller than the dimension of the cavity, as shown by gaps 60 and 62 of FIG. 4. The cup 15 is also sized to be slightly larger than the elastomeric member 40, as shown by gaps 64 and 66, to allow for lateral expansion of the member in the cup. Upon achievement of a good electrical contact between the metal foil 44 and each of the interior contact points 30, it is to be recognized that the foil now forms a shunt across each of the interior contact points. The internal circuitry of the carrier package may now be tested for continuity by simply attaching an electrical lead 70 of a continuity tester 72 to one of the peripheral contact points 34, such as the ground contact, and then sequentially touching the remainder of the external contact points with the other electrical test lead 71 and noting the readings of tester 72. An alternate path could also be obtained by establishing a conducting path between arm 10 and foil 44, and a single contact 34. It is recognized that a single testing block could be created to electronically or simultaneously test all of the peripheral contact points.

The principal innovative features of the carrier package test probe of the present invention reside in the provision of a test probe head having an elastic support member and an elastic metal foil joined to the outer face thereof. The elasticity of the foil is increased through a plurality of slits formed therein. The elastic member causes the foil to be uniformly pressed into good electrical contact with each interior contact point, while the foil simultaneously shunts each of the contact points together. Utilization of the test head in a suitable positioning arm allows for the simple and rapid testing of the internal circuitry within the IC carrier package.

Whereas the preferred embodiment of the present invention has been described above, it is contemplated that other alterations and modifications may become apparent to those skilled in the art after having read the above disclosure. It is therefore intended that the appended claims be interpreted as covering all such alteration and modifications as fall within the true spirit and scope of the invention.

What is claimed is:

1. A test probe for facilitating the conductor continuity testing of integrated circuit carrier packages of the type having a cavity for receiving an integrated circuit chip and having conductors extending between exterior contact points disposed along the outside edges of the package and interior contact points disposed within said cavity, comprising:

test probe head means including;
an elastomeric member having at least a portion shaped to matingly penetrate into the chip receiving cavity of said integrated circuit carrier package, the distal surface of said portion forming an outer face; and
a thin metal foil plate means configured to be approximately co-extensive in size with said outer face and joined thereto, said foil plate means being formed to make simultaneous electrical contact with each interior contact point located within said chip receiving cavity; and
means for carrying said probe head means so as to position said elastomeric member in aligned relation to and in mating engagement with said chip receiving cavity whereby said foil plate means simultaneously engages and shorts all of said interior contact points together so that continuity testing of each said conductor can be accomplished by contacting pairs of said exterior contact points with a continuity tester.

2. A test probe as recited in claim 1 wherein a plurality of slits are provided in said foil plate means.

3. A test probe as recited in claim 2 wherein said slits are arrayed in a symmetrical pattern about the center point of said foil plate means.

4. A test probe as recited in claim 3 wherein each of said slits extends perpendicularly inwardly from an edge of said foil plate means.

5. A test probe as recited in claim 3 wherein said foil plate means is rectangular in shape and said slits extend perpendicularly inwardly from each side thereof, the slits disposed at the middle of each said side being of greatest length, and the slits located closer towards each corner of each side being of progressively shorter lengths, said slits being disposed such that no slit will intersect with any other slit.

6. A test probe as recited in claims 1 or 5 wherein a thin layer of silicone is disposed between said outer face of said elastomeric member and said foil plate means, with one surface of said silicone layer being bonded to said foil plate means and the opposite surface of said silicone layer being bonded to said outer face.

7. A test probe as recited in claims 1 or 5 wherein a filler plate is joined to said foil plate means, said filler plate being centrally disposed relative to the outer edges of said foil plate means and being formed for mating insertion into a lower portion of said chip receiving cavity.

8. A test probe as recited in claim 6 wherein said means for carrying includes a pivotal arm having a receptacle disposed at the outer end thereof, said receptacle being formed to attachably receive said test probe head means, said pivotal arm having a hinge means and an actuating means disposed at the inner end thereof, whereby said outer end of said pivotal arm may be disposed above an integrated circuit carrier package and said actuating means may then be activated to impel said probe head into mating relation within the chip receiving cavity of said carrier package, said actuating means exerting sufficient pressure upon said probe head means so as to cause said elastomeric member to expand within said IC chip cavity pressing said foil plate means into good electrical contact with the interior contact points disposed within said chip receiving cavity.

9. A test probe as recited in claim 6 wherein a filler plate is joined to said foil plate means, said filler plate being centrally disposed relative to the outer edges of said foil plate means and being formed for mating insertion into a lower portion of said chip receiving cavity.

* * * * *